US007325648B2

(12) United States Patent
Sasaki et al.

(10) Patent No.: US 7,325,648 B2
(45) Date of Patent: Feb. 5, 2008

(54) FRAME FOR SPEAKER DEVICE AND SPEAKER DEVICE

(75) Inventors: Hiromitsu Sasaki, Yamagata (JP); Yutaka Moriyama, Yamagata (JP); Eiji Sakaguchi, Saitama (JP); Hidehito Oki, Saitama (JP)

(73) Assignees: Pioneer Corporation, Tokyo (JP); Tohoku Pioneer Corporation, Yamagata (JP); Honda Motor Co., Ltd., Tokyo (JP)

( * ) Notice: Subject to any disclaimer, the term of this patent is extended or adjusted under 35 U.S.C. 154(b) by 156 days.

(21) Appl. No.: 11/354,947

(22) Filed: Feb. 16, 2006

(65) Prior Publication Data

US 2006/0188123 A1 Aug. 24, 2006

(30) Foreign Application Priority Data

Feb. 17, 2005 (JP) ............................ 2005-040057

(51) Int. Cl.
*H04R 1/02* (2006.01)
*H05K 5/02* (2006.01)
*H04B 1/03* (2006.01)

(52) U.S. Cl. ........................ 181/150; 381/302; 381/86; 381/389

(58) Field of Classification Search ................ 181/150, 181/148, 171; 381/302, 86, 332, 386, 389
See application file for complete search history.

(56) References Cited

U.S. PATENT DOCUMENTS 1,967,223 A * 7/1934 Bostwick .................... 181/173
2,123,442 A * 7/1938 McWilliams ................ 181/148
2,154,705 A * 4/1939 Schultz ....................... 381/392
3,201,529 A * 8/1965 Surh .......................... 381/186
3,892,289 A * 7/1975 Rollins ....................... 181/171
3,993,345 A * 11/1976 Croup ..................... 296/37.16
4,152,544 A * 5/1979 Sanpei et al. ............... 181/199
4,277,653 A * 7/1981 Pawelzick ................... 381/395
4,331,841 A * 5/1982 Castagna .................... 381/186
4,465,905 A * 8/1984 Nation ....................... 381/386
4,565,905 A * 1/1986 Nation ....................... 381/186
4,572,326 A * 2/1986 Hutchins ..................... 181/150
4,797,935 A * 1/1989 Tanaka ....................... 381/392
4,847,907 A * 7/1989 Ando .......................... 381/86
4,923,032 A * 5/1990 Nuernberger ............... 181/150
5,115,884 A * 5/1992 Falco ......................... 181/156
5,133,018 A * 7/1992 Miyazaki .................... 381/395
5,532,437 A * 7/1996 Simplicean et al. ........ 181/150
5,703,335 A * 12/1997 Deutsch ...................... 181/150
5,736,689 A * 4/1998 Van Hout et al. ........... 181/141
5,802,191 A * 9/1998 Guenther .................... 381/386

(Continued)

FOREIGN PATENT DOCUMENTS

DE 4126122 A1 * 2/1992

(Continued)

*Primary Examiner*—Edgardo San Martin
(74) *Attorney, Agent, or Firm*—Young & Thompson

(57) ABSTRACT

A frame for a speaker device has an annular outer peripheral portion. The outer peripheral portion includes plural wall portions concentrically formed. An end surface of the wall portion on an inner circumferential side of the outer peripheral portion is formed at a position recessed as compared with an end surface of the wall portion on an outer circumferential side in a direction of a central axis of the outer peripheral portion.

6 Claims, 9 Drawing Sheets

U.S. PATENT DOCUMENTS

| | | | | |
|---|---|---|---|---|
| 5,867,583 | A * | 2/1999 | Hazelwood et al. | 381/395 |
| 6,386,315 | B1 * | 5/2002 | Roy et al. | 181/150 |
| 6,481,173 | B1 * | 11/2002 | Roy et al. | 52/506.07 |
| 6,504,939 | B1 * | 1/2003 | Fukuda | 381/386 |
| 6,505,705 | B1 * | 1/2003 | Espiritu et al. | 181/150 |
| 6,526,150 | B2 * | 2/2003 | Kelly et al. | 381/353 |
| 6,577,741 | B1 * | 6/2003 | Basore | 381/386 |
| 6,578,658 | B2 * | 6/2003 | Jones et al. | 181/141 |
| 6,651,772 | B1 * | 11/2003 | Esser | 181/171 |
| 6,675,930 | B2 * | 1/2004 | Sugiyama et al. | 181/148 |
| 6,904,157 | B2 * | 6/2005 | Shima | 381/388 |
| 6,987,860 | B2 * | 1/2006 | Kurihara et al. | 381/386 |
| 6,990,212 | B2 * | 1/2006 | Kambe | 381/386 |
| 7,062,054 | B2 * | 6/2006 | Nishikawa et al. | 381/182 |
| 7,239,715 | B2 * | 7/2007 | Maekawa et al. | 381/389 |
| 2003/0136605 | A1 * | 7/2003 | Chuang | 181/148 |
| 2004/0037445 | A1 * | 2/2004 | Kirihara et al. | 381/389 |
| 2004/0062407 | A1 * | 4/2004 | Ziegler et al. | 381/189 |
| 2004/0264729 | A1 * | 12/2004 | Ito et al. | 381/389 |
| 2005/0175211 | A1 * | 8/2005 | Suzuki | 381/395 |

FOREIGN PATENT DOCUMENTS

| | | | |
|---|---|---|---|
| JP | 59219098 | A * | 12/1984 |
| JP | 60236399 | A * | 11/1985 |
| JP | 63073799 | A * | 4/1988 |
| JP | 2001-352590 | | 12/2001 |

* cited by examiner

FRAME FOR SPEAKER DEVICE AND SPEAKER DEVICE

BACKGROUND OF THE INVENTION

1. Field of the Invention

The present invention relates to a configuration of a frame for a speaker device.

2. Description of Related Art

Conventionally, there is known a speaker device including a vibrating system having a frame and a diaphragm, and a magnetic circuit system having a yoke, a magnet and a plate. Such a speaker device is preferably used as an on-vehicle speaker device.

In such an on-vehicle speaker device, a cushion member having a cushioning property is attached to a portion on an outer circumferential side of an outer peripheral portion of the frame. When such a speaker device is mounted on a mounting panel (mounting base) such as an inner panel of a vehicle door, the frame is mounted on the mounting base via the cushion member. An example of the speaker device having such a configuration is disclosed in Japanese Patent Application Laid-open under No. 2001-352590.

However, in the above-mentioned speaker device, there is a part of the outer peripheral portion of the frame to which no cushion member is attached. Therefore, when the frame vibrates by driving of the speaker, the part to which no cushion member is attached contacts the mounting panel, which transmits the vibration to the mounting panel. Thereby, a resonance sound problematically occurs.

SUMMARY OF THE INVENTION

The present invention has been achieved in order to solve the above problem. It is an object of this invention to provide a frame for a speaker device and a speaker device using the frame capable of preventing occurrence of a resonance sound at a part of a frame opposite to a mounting panel via no cushion member.

According to one aspect of the present invention, there is provided a frame for a speaker device including an annular outer peripheral portion, wherein the outer peripheral portion includes plural wall portions concentrically formed, and wherein an end surface of the wall portion on an inner circumferential side of the outer peripheral portion is formed at a position recessed as compared with an end surface of the wall portion on an outer circumferential side in a central axis direction of the outer peripheral portion.

The above frame for the speaker device is preferably applied to an on-vehicle speaker device, for example, and it includes the annular outer peripheral portion. The outer peripheral portion serves as a mounting portion when the frame is mounted onto the mounting panel such as an inner panel of a vehicle, for example. Concretely, the outer peripheral portion has the plural wall portions concentrically formed, and the end surface of the wall portion on the outer circumferential side of the outer peripheral portion is mounted onto the mounting panel. Meanwhile, the end surface of the wall portion on the inner circumferential side of the outer peripheral portion is formed at the position recessed in the central axis direction of the outer peripheral portion as compared with the end surface of the wall portion of the outer circumferential side of the outer peripheral portion. Additionally, the end surface of the wall portion on the inner circumferential side of the outer peripheral portion is opposite to the mounting panel with a predetermined distance. Therefore, even though the frame vibrates at the time of the driving of the speaker device, the end surface of the wall portion on the inner circumferential side of the outer peripheral portion never contacts the mounting panel, and no vibration is transmitted to the mounting panel. Thereby, it can be prevented that the vibration of the mounting panel causes the resonance sound.

In a preferred example of the frame for the speaker device, the end surfaces may be positioned on a side opposite to a sound output side of the speaker device. Additionally, in another preferred example, the end surfaces may be positioned on a side opposite to a mounting panel onto which the speaker device is mounted. Namely, the speaker device is mounted onto the mounting panel at the outer peripheral portion on the side opposite to the sound output side, i.e., on the rear side.

In a manner of the above frame for the speaker device, a cushion member contacting the mounting panel may be attached to the end surface of the wall portion on the outer circumferential side. In this manner, the end surface of the wall portion on the outer circumferential side of the outer peripheral portion is mounted onto the mounting panel via the cushion member. At the time of the driving of the speaker device, the vibration sometimes occurs to the frame. However, since the wall portion on the outer circumferential side of the outer peripheral portion is mounted onto the mounting panel via the cushion member, the vibration of the frame is never transmitted to the mounting panel.

In still another preferred example of the above frame for the speaker device, a step maybe formed in the central axis direction between the end surface of the wall portion on the outer circumferential side and the end surface of the wall portion on the inner circumferential side. By setting the step having a sufficient size, the contact between the wall portion on the inner circumferential side of the outer peripheral portion and the mounting panel can be securely prevented.

The nature, utility, and further features of this invention will be more clearly apparent from the following detailed description with respect to preferred embodiment of the invention when read in conjunction with the accompanying drawings briefly described below.

DETAILED DESCRIPTION OF THE PREFERRED EMBODIMENTS

The preferred embodiments of the present invention will now be described below with reference to the attached drawings.

[Configuration of Speaker Device]

First, a description will be given of a configuration of a speaker device 100 according to an embodiment of the present invention with reference to FIG. 1 to FIG. 5.

Figure 1:
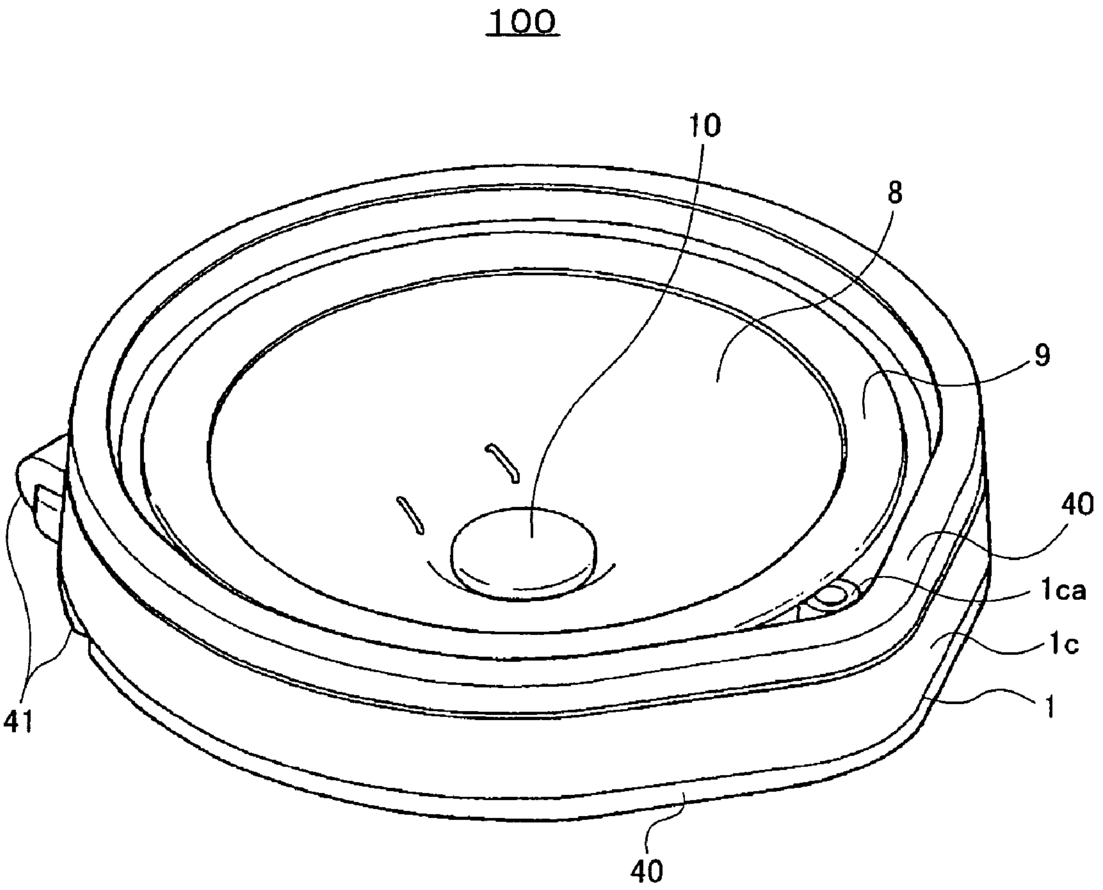
FIG. 1 shows a perspective view of a speaker device according to an embodiment of the present invention when observed from a sound output side.
Figure 2:
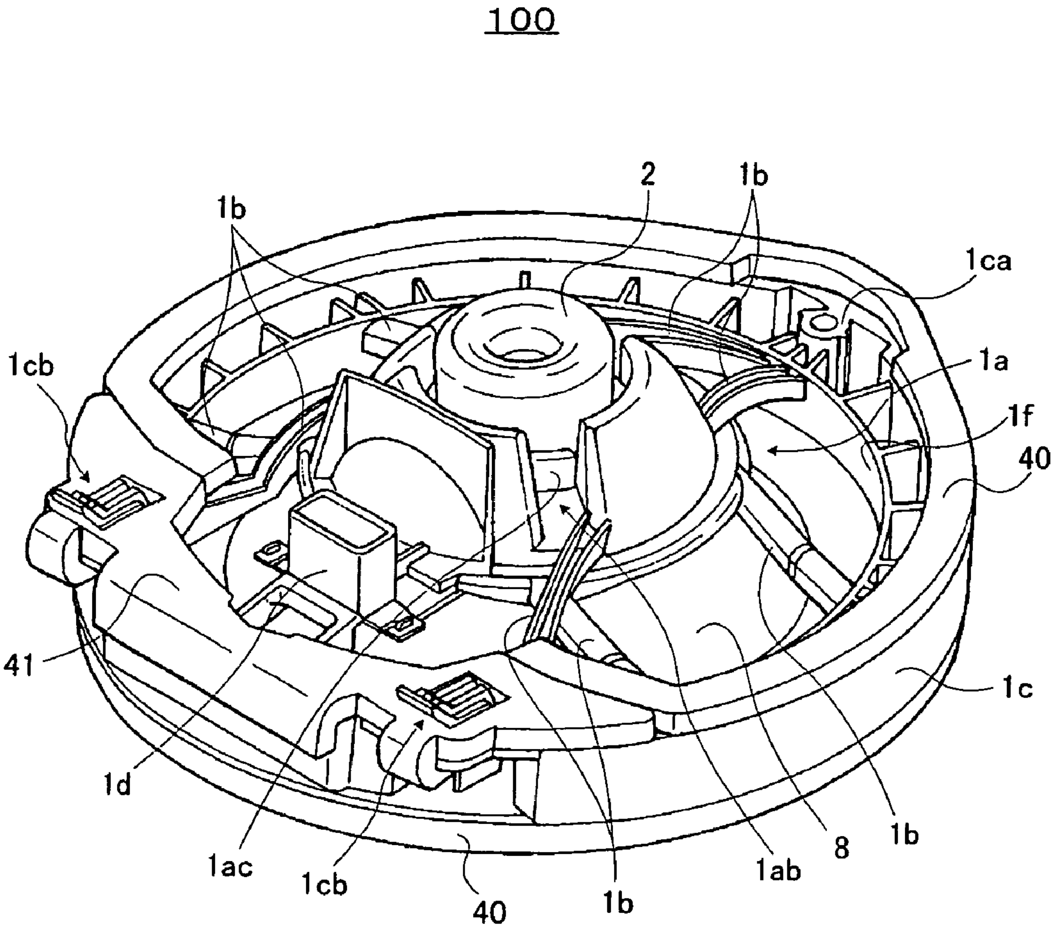
FIG. 2 shows a perspective view of the speaker device according to the embodiment when observed from a side opposite to the sound output side.
Figure 3:
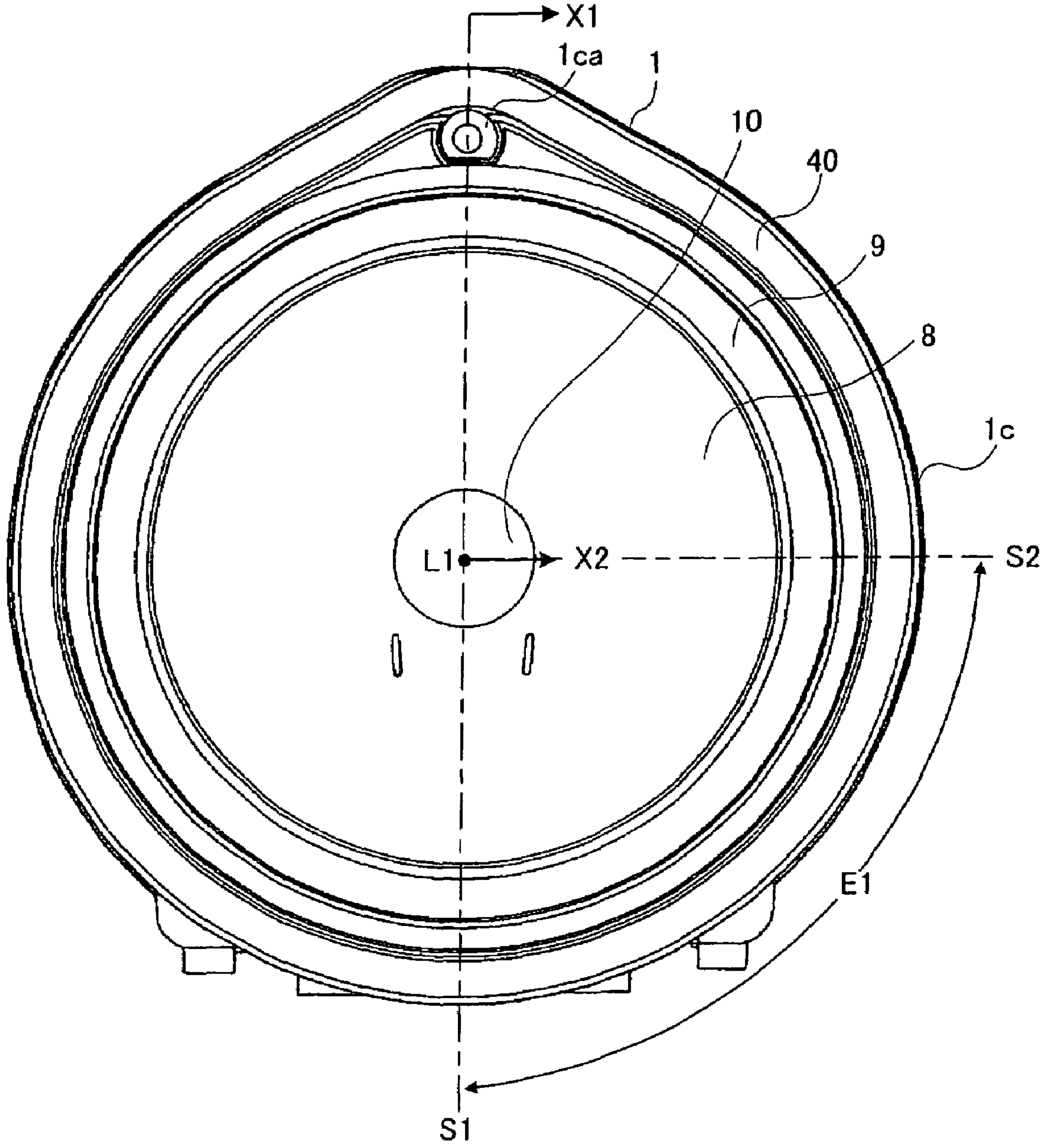
FIG. 3 shows a front view of the speaker device according to the embodiment.
Figure 4:
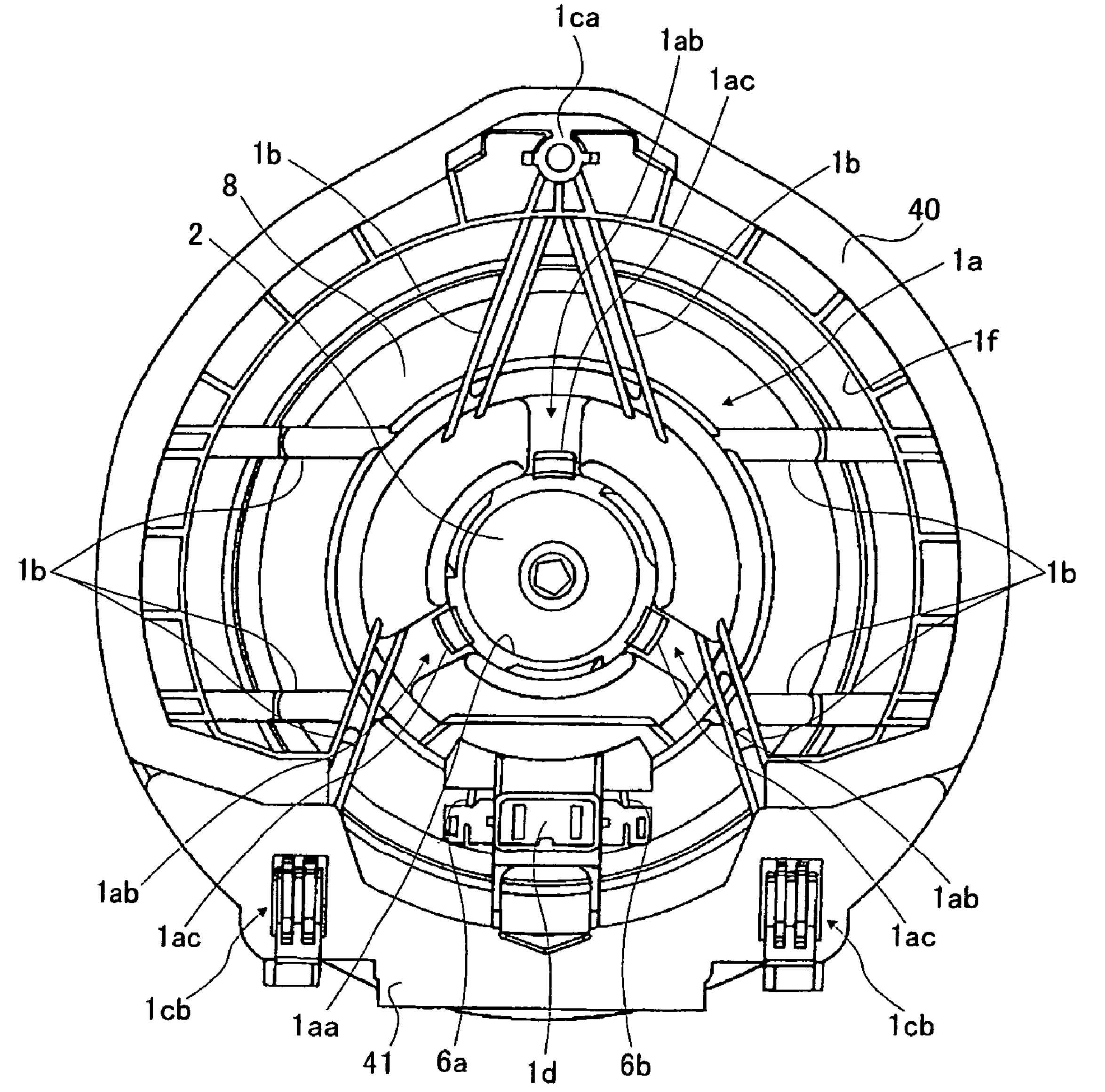
FIG. 4 shows a rear view of the speaker device according to the embodiment.
Figure 5:
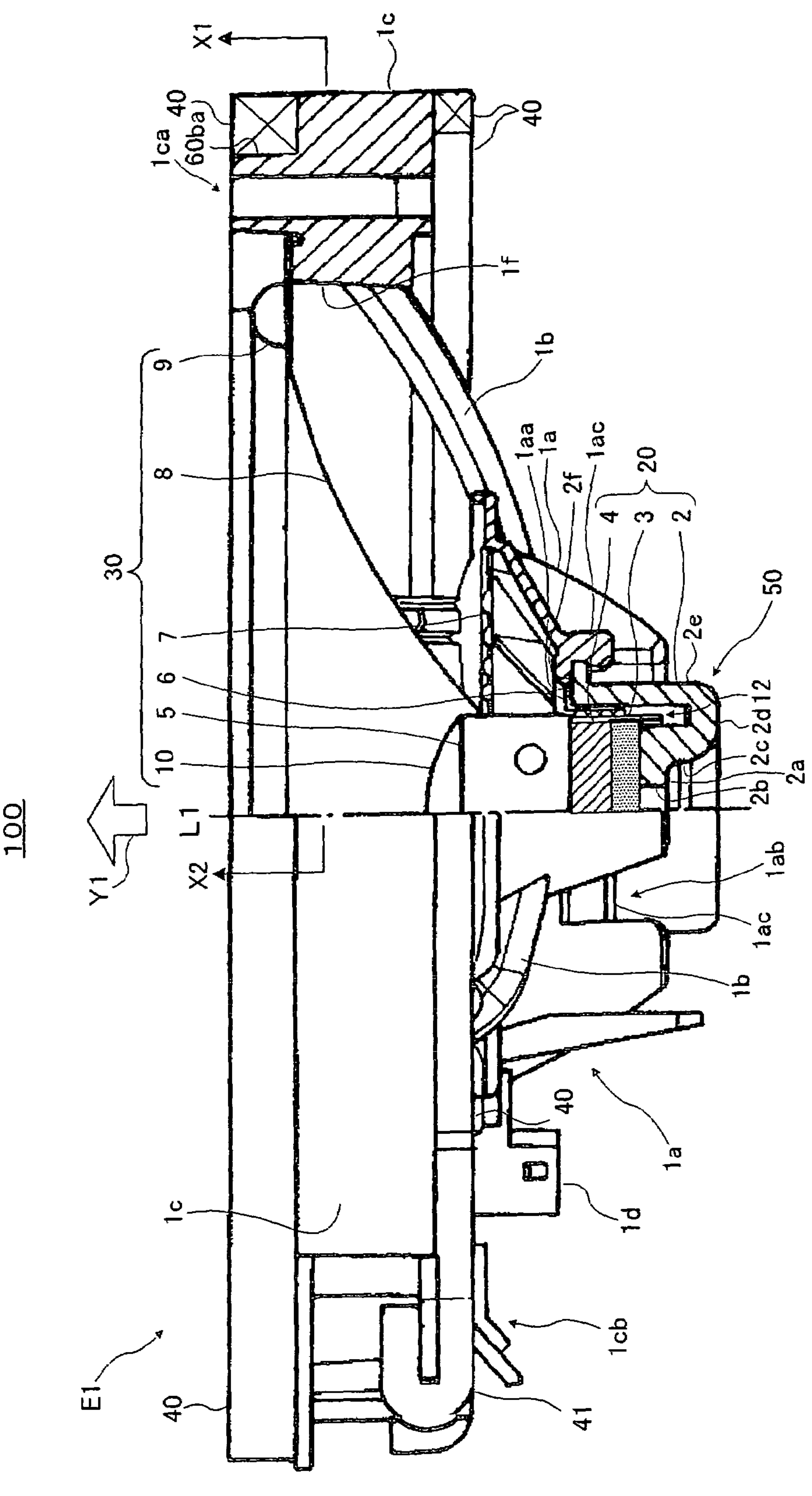
FIG. 5 shows a one-side sectional view and a one-side side view of the speaker device according to the embodiment.

FIG. 1 shows a perspective view of the speaker device 100 according to an embodiment of the present invention in a case that it is observed from its sound output side. FIG. 2 shows a perspective view of the speaker device 100 in a case that it is observed from a side opposite to the sound output side, i.e., from a rear side. FIG. 3 shows a front view of the speaker device 100 in the case that it is observed from the sound output side. FIG. 4 shows a rear view of the speaker device 100 in the case that it is observed from the side opposite to the sound output side, i.e., from the rear side. FIG. 5 shows a sectional view of the speaker device 100 on the right side of the drawing with respect to a central axis L1 of the speaker device 100 (or a frame 1) and a side view of the speaker device 100 on the left side of the drawing with respect to the central axis L1, respectively. In addition, the sectional view shown on the right side of FIG. 5 is a sectional view taken along the cutting-plane line X1-X2 of the speaker device 100 shown in FIG. 3. The side view shown on the left side of FIG. 5 corresponds to a side surface portion E1 of the speaker device 100 between a plane surface S1 passing through the central axis L1 of the speaker device 100 and a plane surface S2 passing through the central axis L1 and perpendicular to the plane surface S1 in FIG. 3.

The speaker device 100 according to this embodiment can be preferably used as an on-vehicle speaker device. The speaker device 100 is configured by mounting a speaker unit 50 onto the frame 1.

The speaker unit 50 includes a magnetic circuit system 20 having a yoke 2, a magnet 3 and a plate 4, and a vibrating system 30 having a voice coil bobbin 5, a voice coil 6, a damper 7, a diaphragm 8, an edge 9 and a cap 10.

First, each component of the magnetic circuit system 20 will be explained.

The magnetic circuit system 20 is configured as an internal magnet type magnetic circuit.

The yoke 2 is formed into a substantial pot shape. The yoke 2 has a first flat portion 2*a* for supporting a disc-shape magnet 3, an opening 2*b* formed at a substantial center of the first flat portion 2*a*, a first cylindrical portion 2*c* connected to an outer peripheral portion of the first flat portion 2*a*, a second flat portion 2*d* connected to a lower end portion of the first cylindrical portion 2*c*, a second cylindrical portion 2*e* connected to an outer peripheral portion of the second flat portion 2*d* and a flange portion 2*f* connected to an upper end portion of the second cylindrical portion 2*e* and outwardly extending from the upper end portion. Each of the components is integrally formed.

An upper surface of the first flat portion 2*a* has flatness. The opening 2*b* has a function of radiating a heat generated in the magnetic circuit system 20 to the outside. The first cylindrical portion 2*c* is formed into a cylindrical shape. In FIG. 5, by forming the first cylindrical portion 2*c* to have a predetermined length in the direction of an arrow Y1, a relative positional relation of components of the vibrating system 30 with respect to the magnet 3 and the plate 4 can be adjusted. A lower surface of the second flat portion 2*d* has flatness. The second flat portion 2*d* has a function of forming a constant gap between the first cylindrical portion 2*c* and the second cylindrical portion 2*e*. The second cylindrical portion 2*e* is formed into a cylindrical shape and is provided on the outer side of the first cylindrical portion 2*c*. The second cylindrical portion 2*e* has a function of forming a magnetic gap 12 between an inner peripheral wall of the second cylindrical portion 2*e* and each of the outer peripheral walls of the magnet 3 and the plate 4. The flange portion 2*f* is fixed to a magnetic circuit housing unit 1*a* being a component of the frame 1. By mounting the flange portion 2*f* onto the magnetic circuit housing unit 1*a*, the magnetic circuit system 20 can be housed in the magnetic circuit housing unit 1*a*.

The magnet 3 is formed into a disc shape and is mounted onto the first flat portion 2*a* of the yoke 2. On the magnet 3, the disc-shape plate 4 having the substantially same diameter as the magnet 3 is mounted.

In the magnetic circuit system 20 having such a configuration, the magnet 3 and the plate 4 configure the magnetic circuit, and magnetic flux of the magnet 3 is concentrated on the magnetic gap 12 formed between the outer peripheral wall of the plate 4 and the inner peripheral wall of the second cylindrical portion 2*e*.

Next, each component of the vibrating system 30 will be explained.

The voice coil bobbin 5 is formed into a substantially cylindrical shape. The voice coil 6 which will be explained later is wound around the vicinity of the lower end portion of the outer peripheral wall of the voice coil bobbin 5. The vicinity of the lower end portion of the inner peripheral wall of the voice coil bobbin 5 is opposite to each of the outer peripheral walls of the magnet 3 and the plate 4 with constant spaces therebetween. Meanwhile, the vicinity of the lower end portion of the outer peripheral wall of the voice coil bobbin 5 is opposite to the vicinity of the upper end portion of the inner peripheral wall of the second cylindrical portion 2*e* being the component of the yoke 2 with a constant space therebetween. A gap (magnetic gap 12) is formed between the inner peripheral wall of the second cylindrical portion 2*e* and the outer peripheral wall of the plate 4.

The voice coil 6 has one wiring, which includes a plus lead wire 6*a* and a minus lead wire 6*b* as shown in FIG. 4. The plus lead wire 6*a* is an input wiring for an L (or R)-channel signal, and the minus lead wire 6*b* is an input wiring for a ground (GND:ground) signal. The lead wires 6*a* and 6*b* are electrically connected to a terminal 1*d* provided on the frame 1. In addition, the terminal 1*d* is electrically connected to a wiring on an output side of an amplifier (not shown). Thereby, the signal and the power of one channel are inputted to the voice coil 6 from the amplifier side via the terminal 1*d* and the lead wires 6*a* and 6*b*.

The damper 7 is formed into an annular shape and has an elastic portion on which corrugations are concentrically formed. An inner peripheral edge portion of the damper 7 is mounted onto the vicinity of the upper end portion of the outer peripheral wall of the voice coil bobbin 5. Meanwhile, an outer peripheral edge portion of the damper 7 is mounted onto the outer peripheral portion of the magnetic circuit housing unit 1*a*.

Various kinds of materials such as paper, high polymer and metal can be applied to the diaphragm 8 in accordance with the various use purposes. The diaphragm 8 is formed into a cone shape. An inner peripheral edge portion of the diaphragm 8 is mounted onto the vicinity of the upper end portion of the outer peripheral wall of the voice coil bobbin 5 and onto the upper side of the damper 7. Meanwhile, the outer peripheral edge portion of the diaphragm 8 is mounted onto the inner peripheral edge portion of the annular edge 9. The outer peripheral edge portion of the edge 9 is mounted onto an outer peripheral portion 1*c* of the frame 1. In this example, the diaphragm 8 and the edge 9 are independently formed. However, this invention is not limited to this. Namely, the diaphragm 8 and the edge 9 may be integrally formed.

The cap 10 is formed into a substantial dome shape and is mounted onto the outer peripheral wall of the voice coil bobbin 5 in a manner to cover the upper surface of the voice coil bobbin 5. Thereby, it can be prevented that dust and foreign matter enter the inner side of the speaker unit 50.

The frame 1 is formed with various kinds of materials such as a metal and a resin. For the purpose of lightening the speaker device 100, the frame 1 is preferably formed with a resin material. The frame 1 mainly includes the magnetic circuit housing unit 1*a*, the outer peripheral portion 1*c* arranged on the outer side and the upper side of the magnetic circuit housing unit 1*a*, plural arm portions 1*b* connecting the magnetic circuit housing unit 1*a* and the outer peripheral portion 1*c*, and the terminal 1*d* provided in the vicinity of the outer peripheral portion of the magnetic circuit housing unit 1*a*. Each of the components is integrally formed. In addition, on the frame 1, an opening 1*f* is formed between the magnetic circuit housing unit 1*a* and the outer peripheral portion 1*c*.

The magnetic circuit housing unit 1*a* is formed into a substantial bowl shape and has an opening 1*aa*, cut-out portions 1*ab* and plural fixing portions 1*ac*. The diameter of the opening 1*aa* is substantially same as an outside diameter of the second cylindrical portion 2*e* of the yoke 2. When the central axis direction L1 of the speaker device 100 is prescribed as the vertical direction in FIG. 5, the opening 1*aa* is formed at a position corresponding to the substantial center of the vertical direction of the magnetic circuit housing unit 1*a*. Each of the cut-out portions 1*ab* is formed by removing a part of the outer peripheral wall of the magnetic circuit housing unit 1*a*, and it is formed in the vicinity of the outer peripheral wall thereof with proper spaces therebetween. Each of the fixing portions 1*ac* is formed in the vicinity of the opening 1*aa* and at a position corresponding to the cut-out portion 1*ab*. In addition, each of the fixing portions 1*ac* is formed along the circumferential direction of the opening 1*aa* with proper spaces therebetween.

One end of each arm portion 1*b* is mounted onto the outer peripheral wall of the magnetic circuit housing unit 1*a*, and the other end thereof is attached to the inner peripheral wall of the outer peripheral portion 1*c*.

The outer peripheral portion 1*c* is formed into a substantially annular shape, and is provided on the outer side of the magnetic circuit housing unit 1*a* and the plural arm portions 1*b*. The outer peripheral portion of the edge 9 and cushion members 40 and 41 are mounted onto the outer peripheral portion 1*c*. The outer peripheral portion 1*c* has mounting portions 1*ca* and 1*cb* for mounting the speaker device 100 onto the mounting base such as an inner panel of the vehicle door, for example.

The mounting portion 1*ca* is an inserting hole into which a bolt is inserted, and is provided at the position opposite to the terminal 1*d* at the outer peripheral portion 1*c*. The mounting portions 1*cb* are formed into a claw shape, and they are provided at the position opposite to the mounting portion 1*ca* on the lower surface side of the outer peripheral portion 1*c* and in the vicinity of the terminal 1*d*. In addition, the one mounting portion 1*cb* and the other mounting portion 1*cb* are provided on the lower surface side of the outer peripheral portion 1*c* with a constant space therebetween.

To the upper surface of the outer peripheral portion 1*c* and a part of the lower surface of the outer peripheral portion 1*c*, a cushion member 40 having a cushion property and formed into a stick shape are attached in a state deformed into a substantial circle shape. As the cushion member 40, a member having an elastic property such as sponge and urethane is preferable, for example. In addition, to the other part of the lower surface of the outer peripheral portion 1*c* on the side of the plural mounting portions 1*cb*, a cushion member 41 formed with the same member as the cushion member 40 and formed into a shape shown in FIG. 5 is attached. Onto one surface of each of the cushion members 40 and 41, a seal having an adhesive property is printed or an adhesive is applied.

The above-mentioned speaker unit 50 is mounted onto the frame 1 in a manner which will be explained below. In FIG. 5, the voice coil bobbin 5 and the cap 10 being the components of the vibrating system 30 are inserted into the opening 1*aa* of the magnetic circuit housing unit 1*a* from the direction of the arrow Y1, and the upper end portion of the voice coil bobbin 5 and the cap 10 are disposed at the upper portion of the surface on the sound output side of the diaphragm 8. In this state, the flange portion 2*f* being the component of the yoke 2 is fixed to the plural fixing portions 1*ac* provided in the magnetic circuit housing unit 1*a*. In this manner, the speaker unit 50 is mounted onto an appropriate position of the frame 1, and the speaker device 100 is configured.

In the speaker device 100 having the above-mentioned configuration, the signal and power outputted from the amplifier are inputted to the voice coil 6 via the terminal 1*d*, and the lead wires 6*a* and 6*b* of the voice coil 6. Thereby, a driving force occurs to the voice coil 6 in the magnetic gap 12, which vibrates the diaphragm 8 in the central axis direction L1 of the speaker device 100 in FIG. 5. In this manner, the speaker device 100 emits an acoustic wave in the direction of the arrow Y1 shown in FIG. 5.

(Configuration of Frame)

Next, a description will be given of the configuration of the frame 1 characterizing the present invention, with reference to FIG. 6 to FIG. 9. An embodiment according to the present invention is characterized by the configuration of the outer peripheral portion 1*c* of the frame 1 mounted onto the mounting panel such as the inner panel of the vehicle. Therefore, this point will be mainly explained below.

Figure 6:
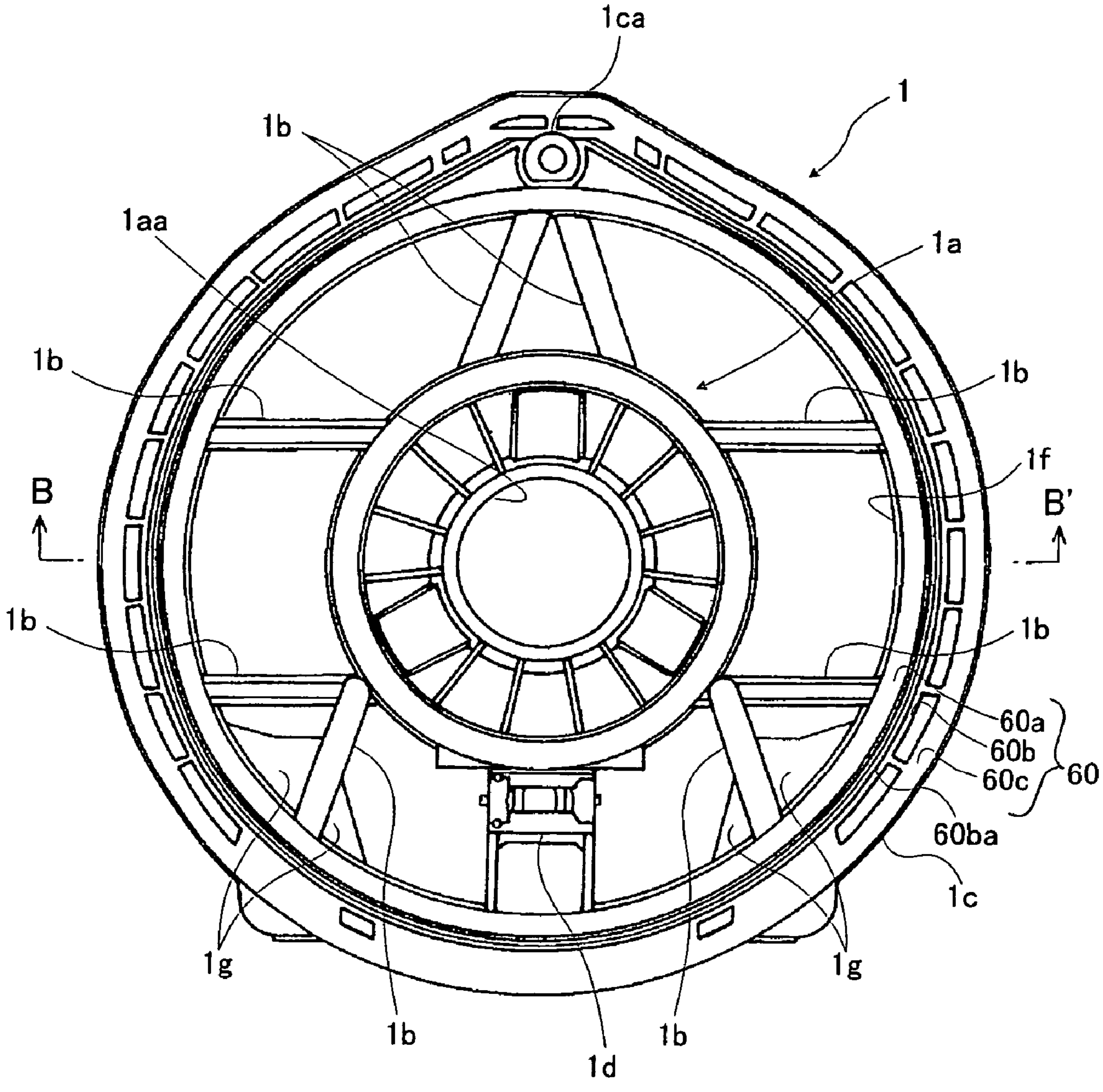
FIG. 6 shows a front view of a frame according to the embodiment of the present invention.
Figure 7:
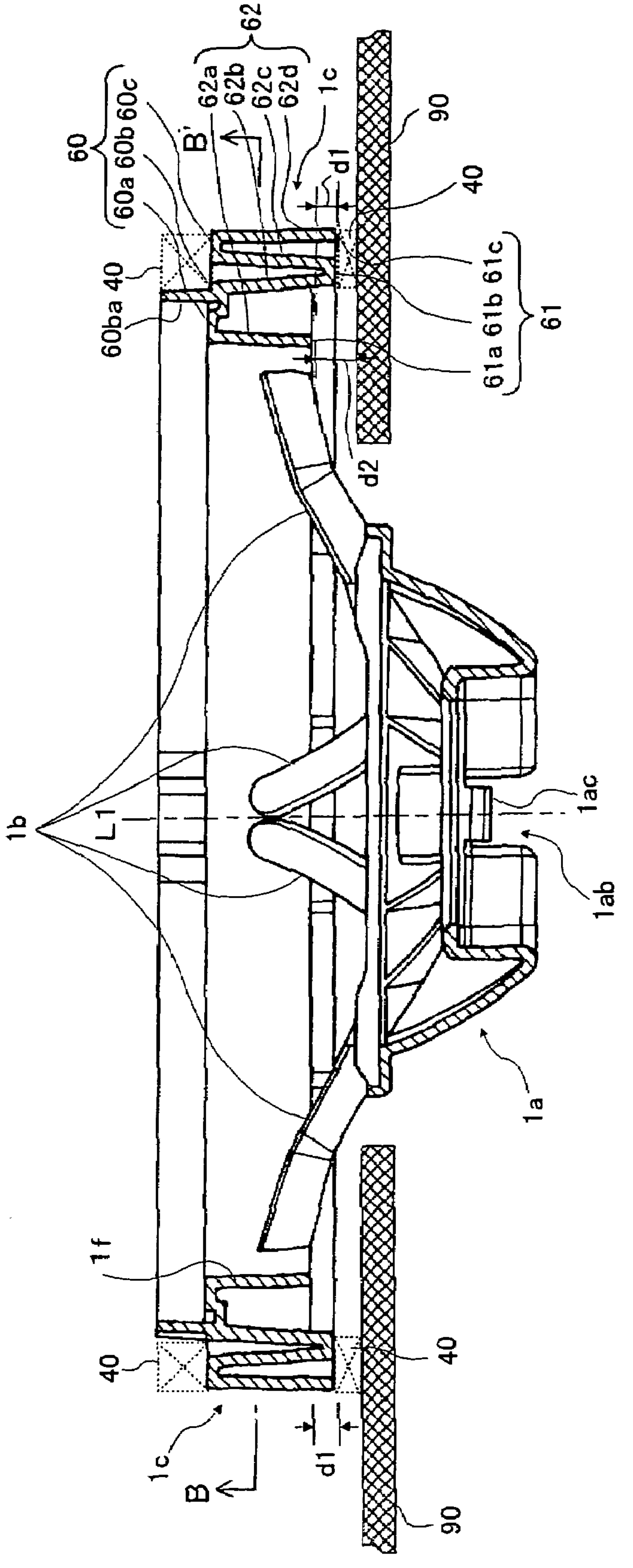
FIG. 7 shows a sectional view of the frame taken along a cutting-plane line B-B' shown in FIG. 6.
Figure 8:
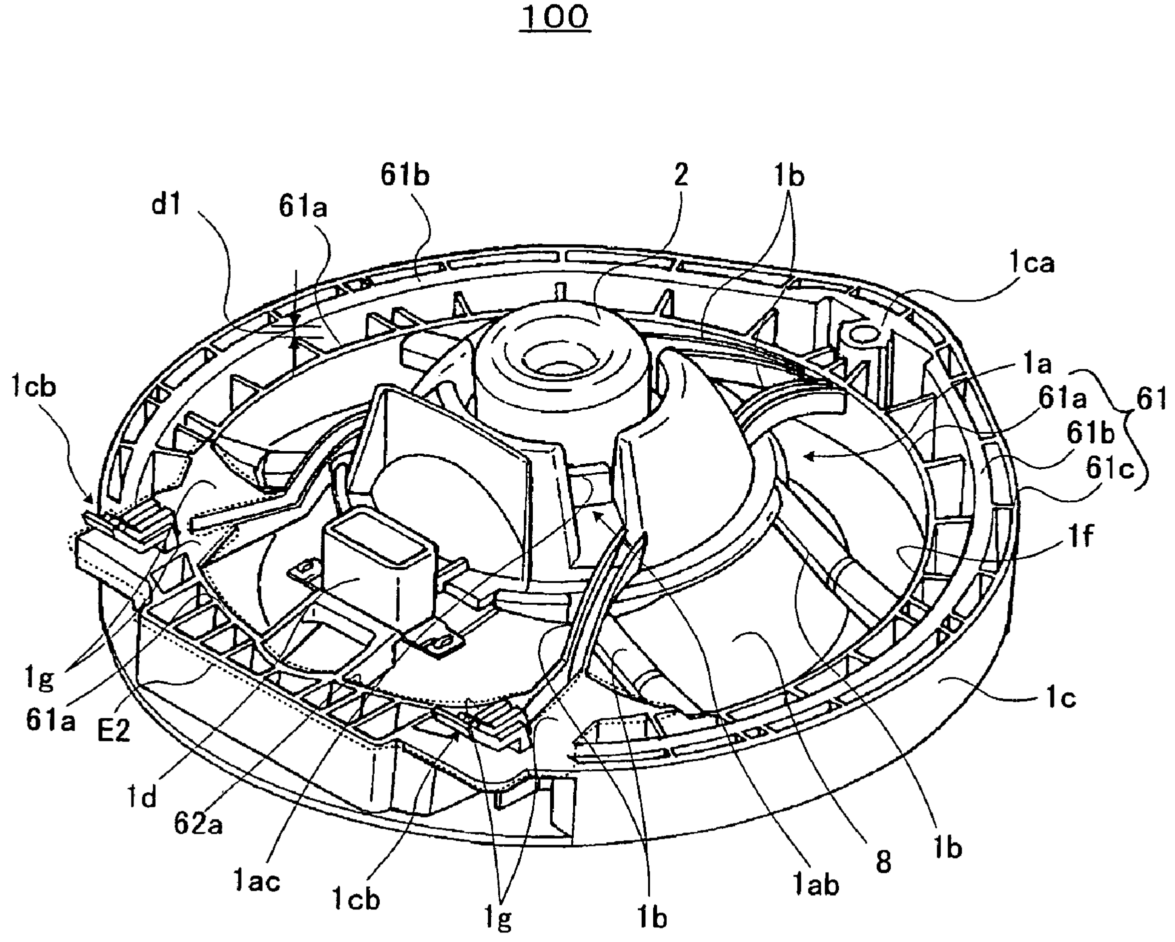
FIG. 8 is a perspective view of the speaker device corresponding to the perspective view shown in FIG. 2.
Figure 9:
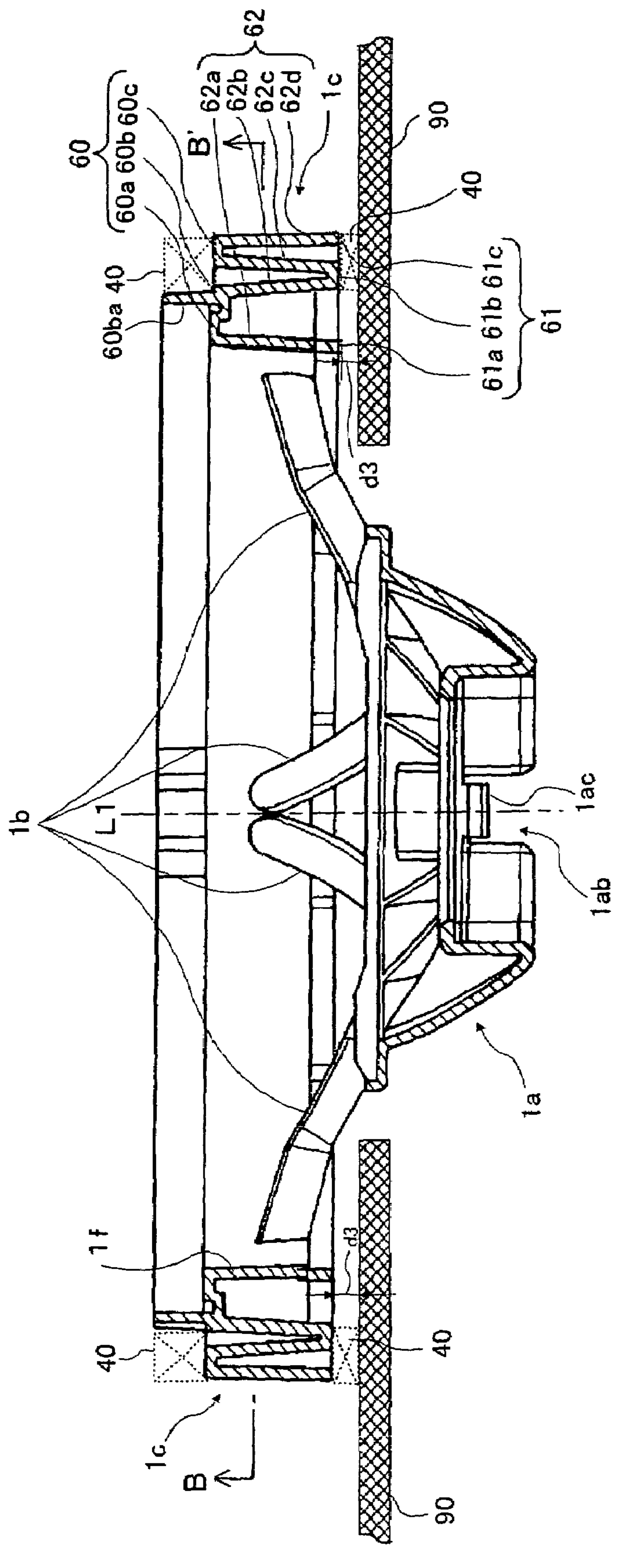
FIG. 9 is a sectional view of the speaker device according to a comparative example.

FIG. 6 shows a front view of the frame 1. FIG. 7 shows a sectional view of the frame 1 taken along the cutting-plane line B-B' shown in FIG. 6. In FIG. 7, the cushion member 40 attached to the outer peripheral portion 1*c* and the mounting panel (mounting base) onto which the frame 1 is mounted are also shown. FIG. 8 shows a rear view of the frame 1.

The basic configuration of the frame 1 is described above. The outer peripheral portion 1*c* of the frame 1 includes an upper surface 60, a lower surface 61 and a connecting portion (wall portion) 62 connecting the upper surface 60 and the lower surface 61, and each of the components is integrally formed. The configuration of the lower surface 61 of the outer peripheral portion 1*c* of the frame 1, which will be explained below, corresponds to the configuration of the portion of the lower surface of the outer peripheral portion 1*c* other than an area E2 in FIG. 8. The lower surface side of the outer peripheral portion 1*c* of the frame 1, corresponding to the area E2, and the lower surface side of the outer peripheral portion 1*c* other than the area E2 are mounted on the mounting panel (mounting base) via the cushion member 40 and/or the cushion member 41.

The upper surface 60 is formed into an annular shape and includes plural flat surfaces having flatness, i.e., a flat surface 60*a*, a flat surface 60*b* and a flat surface 60*c*. As shown in FIG. 7, the flat surface 60*a* is formed on the side of the inner peripheral wall of the outer peripheral portion 1*c*. The outer peripheral edge portion of the edge 9 is mounted on the flat surface 60*a*, which supports the edge 9. The flat surface 60*b* is formed on the outer side of the flat surface 60*a*. On a part of the flat surface 60*b*, an annular projecting portion 60*ba* which projects on the upper side of the drawing and which is formed into an annular shape is formed. The annular projecting portion 60*ba* has a function of positioning the cushion member 40 at an appropriate position of the upper surface 60 of the outer peripheral portion 1*c*. In a preferred example, height of the annular projecting portion 60*ba* maybe same as thickness of the cushion member 40. The flat surface 60*c* is formed on the outer side of the flat surface 60*b* with a constant space from the flat surface 60*b*. Namely, the flat surface 60*c* is formed on the side of the outer peripheral wall of the outer peripheral portion 1*c*. The flat surface 60*a*, the flat surface 60*b* and the flat surface 60*c* are arranged on the same surface. As shown in FIG. 7, the cushion member 40 (broken-line portion) is attached onto the flat surface 60*b* and the flat surface 60*c* out of the plural flat surfaces.

On the other hand, the lower surface 61 is formed into a substantially annular shape and has plural surfaces having flatness, i.e., a flat surface 61*a*, a flat surface 61*b* and a flat surface 61*c*. As shown in FIG. 7, the flat surface 61*a* is formed on the side of the inner peripheral wall of the outer peripheral portion 1*c* and at a position overlapping with a part of the flat surface 60*a*. The flat surface 61*b* is formed on the outer side of the flat surface 61*a* with a constant surface from the flat surface 61*a*. The flat surface 61*c* is formed on the outer side of the flat surface 61*b* and at a position overlapping with a part of the flat surface 60*c* with a constant space from the flat surface 61*b*. The flat surface 61*b* and the flat surface 61*c* are on the same surface. The flat surface 61*a* is positioned at an upper position as compared with the flat surfaces 61*b* and 61*c*. Namely, there is a step between the flat surface 61*a* and the flat surfaces 61*b* and 61*c*. As shown in FIG. 7, the cushion member 40 (broken-line portion) is attached to the flat surfaces 61*b* and 61*c* being the components of the lower surface 61.

The connecting portion 62 is formed into an annular shape and has plural connecting portions, i.e., a connecting portion (wall portion) 62*a*, a connecting portion (wall portion) 62*b*, a connecting portion (wall portion) 62*c* and a connecting portion (wall portion) 62*d*. Each connecting portion being the component of the connecting portions 62 is formed to extend in the direction perpendicular to the upper surface 60 and the lower surface 61. The connecting portion 62*a* constructs the wall portion of the inner circumferential side of the outer peripheral portion 1*c*, and the connecting portions 62*b* to 62*d* construct the wall portion on the outer circumferential side of the outer peripheral portion 1*c*.

As shown in FIG. 7, the connecting portion 62*a* extends from the flat surface 61*a* being the component of the lower surface 61 to an end of the flat surface 60*a* being the component of the upper surface 60 to connect the flat surface 61*a* and the flat surface 60*a*. The inner peripheral wall of the connecting portion 62*a* corresponds to the inner peripheral wall of the outer peripheral portion 1*c*. The connecting portion 62*b* extends from an end of the flat surface 60*b* being the component of the upper surface 60 to an end of the flat surface 61*b* being the component of the lower surface 61 to connect the flat surface 60*b* and the flat surface 61*b*. The connecting portion 62*c* extends from another end of the flat surface 61*b* being the component of the lower surface 61 to one end of the flat surface 60*c* being the component of the upper surface 60 to connect the flat surface 61*b* and the flat surface 60*c*. The connecting portion 62*d* extends from another end of the flat surface 60*c* being the component of the upper surface 60 to the flat surface 61*c* being the component of the lower surface 61 to connect the flat surface 60*c* and the flat surface 61*c*. The outer peripheral wall of the connecting portion 62*d* corresponds to the outer peripheral wall of the outer peripheral portion 1*c*.

As shown in FIG. 7, the sectional shape of the outer peripheral portion 1*c* of the frame 1 having the above-mentioned configuration is formed into an accordion or bellows shape. In this embodiment, the flat surfaces 61*b* and 60*c* to which the cushion member 40 is attached are provided between the outer peripheral wall (connecting portion 62*d*) of the outer peripheral portion 1*c* and the inner side of the outer peripheral wall of the outer peripheral portion 1*c*, i.e., the inner peripheral wall (connecting portion 62*a*) of the outer peripheral portion 1*c*, not the outer side of the outer peripheral wall thereof, respectively.

In addition, as described above, at the outer peripheral portion 1*c* of the frame 1, one cushion member 40 formed into the stick shape is attached to the flat surfaces 60*b* and 60*c* out of the plural flat surfaces being the components of the upper surface 60, and another cushion member 40 is attached to the flat surface 61*b* and the flat surface 61*c* out of the plural flat surfaces being the components of the lower surface 61. FIG. 1 to FIG. 5 show such a state that the cushion members 40 formed into the stick shape are deformed into a substantial circle shape to be attached to each of the above-mentioned flat surfaces. In FIG. 1 to FIG. 5, the reference numerals of the respective components of the outer peripheral portion 1*c* are omitted for convenience of an explanation. Therefore, as for the positional relation between the cushion members 40 and each component of the outer peripheral portion 1*c*, FIG. 6 to FIG. 8 should be referred to.

As shown in FIG. 7, the outer peripheral portion 1*c* of the frame 1 is mounted onto a mounting panel 90 via the cushion member 40. The frame 1 is fixed to the mounting panel 90 by the above-mentioned mounting portions 1*ca* and 1*cb*. In this embodiment, the lower end surface 61*a* of the connecting portion 62*a* being the wall portion on the inner circumferential side of the outer peripheral portion 1*c* is formed at a position recessed in the central axis direction L1 of the outer peripheral portion 1*c* (on upper side in FIG. 7) as compared with the lower surfaces 61*b* and 61*c* of the connecting portions 61*b* to 62*d* being the wall portion on the outer circumferential side of the outer peripheral portion 1*c*. That is, the lower end surface 61*a* is formed at a position remote from the mounting panel 90 as compared with the lower end surfaces 61*b* and 61*c*. Thereby, as shown in FIG. 7 and FIG. 8, a step d1 is formed between the lower end surface 61*a* of the connecting portion 62*a* on the inner circumferential side of the outer peripheral portion 1*c* and the lower end portions 61*b* and 61*c* of the connecting portions 62*b* to 62*d* on the outer circumferential side of the outer peripheral portion 1*c*.

As shown in FIG. 7, in such a state that the frame 1 is mounted onto the mounting panel 90, the lower end surface 61*a* of the connecting portion 62*a* being the wall portion on the inner circumferential side of the outer peripheral portion 1*c* is remote from the mounting panel 90 by a distance d2 corresponding to a sum of the step d1 and the thickness of the cushion member 40 attached to the mounting panel 90. The connecting portions 62*b* to 62*d* on the outer circumferential side of the outer peripheral portion 1*c* of the frame 1 are mounted on the mounting panel 90 via the cushion member 40. However, the connecting portion 62*a* on the inner circumferential side of the outer peripheral portion 1*c* of the frame 1 is opposite to the mounting panel 90, not via the cushion member 40. Therefore, when the distance d2 between the lower end portion 61*a* of the connecting portion 62 on the inner circumferential side and the mounting panel 90 is small, at the time of the driving of the speaker device 100, the frame 1 and the mounting panel 90 contact, and the vibration of the frame 1 is transmitted to the mounting panel 90. Then, resonance of the vibration of the frame 1 and the vibration of the mounting panel 90 problematically causes a resonance sound. For example, as a comparative example shown in FIG. 9, if the frame 1 is formed so that the lower end portion 61*a* of the wall portion 62*a* on the inner circumferential side of the outer peripheral portion 1*c* is positioned flush with the lower end portions 61*b* and 61*c* of the wall portions 62*b* to 62*d* on the outer circumferential side (i.e., on the same surface in the direction of the central axis L1), the distance d3 between the lower end portion 61*a* of the wall portion 62*a* on the inner circumferential side and the mounting panel 90 becomes small, and hence the above-mentioned resonance sound can easily occur.

On the other hand, in this embodiment, as shown in FIG. 7 and FIG. 8, the lower portion 61*a* of the connecting portion 62*a* being the wall portion on the inner circumferential side of the outer peripheral portion 1*c* is formed at the position recessed as compared with the lower end portions 61*b* and 61*c* of the connecting portions 62*b* to 62*d* being the wall portion on the outer circumferential side of the outer peripheral portion 1*c* so that the step d1 having the sufficient distance exists. Therefore, as described above, it can be prevented that the vibrations of the frame and the mounting panel cause the resonance sound.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No. 2005-040057 filed on Feb. 17, 2005 including the specification, claims, drawings and summary is incorporated herein by reference in its entirety.

What is claimed is:

1. A frame for a speaker device comprising an annular outer peripheral portion, wherein the outer peripheral portion includes plural wall portions concentrically formed, and wherein an end surface of the wall portion on an inner circumferential side of the outer peripheral portion is formed at a position recessed as compared with an end surface of the wall portion on an outer circumferential side in a direction of a central axis of the outer peripheral portion.

2. The frame for the speaker device according to claim 1, wherein the end surfaces are positioned on a side opposite to a sound output side of the speaker device.

3. The frame for the speaker device according to claim 1, wherein the end surfaces are positioned on a side opposite to a mounting panel onto which the speaker device is mounted.

4. The frame for the speaker device according to claim 3, wherein a cushion member contacting the mounting panel is attached to the end surface of the wall portion on the outer circumferential side.

5. The frame for the speaker device according to claim 1, wherein a step is formed in the central axis direction between the end surface of the wall portion on the outer circumferential side and the end surface of the wall portion on the inner circumferential side.

6. A speaker device comprising a frame, the frame comprising an annular outer peripheral portion, wherein the outer peripheral portion includes plural wall portions concentrically formed, and wherein an end surface of the wall portion on an inner circumferential side of the outer peripheral portion is formed at a position recessed as compared with an end surface of the wall portion on an outer circumferential side in a direction of a central axis of the outer peripheral portion.

* * * * *